United States Patent
Peters et al.

(10) Patent No.: US 6,480,817 B1
(45) Date of Patent: Nov. 12, 2002

(54) INTEGRATED CIRCUIT I/O PAD CELL MODELING

(75) Inventors: Michael J. Peters; Richard L. Collins; David M. Musolf; Patrick R. Bashford; Bradley J. Wright, all of Fort Collins, CO (US)

(73) Assignee: Hynix Semiconductor, Inc., Seoul (KR)

( * ) Notice: Subject to any disclaimer, the term of this patent is extended or adjusted under 35 U.S.C. 154(b) by 0 days.

(21) Appl. No.: 08/299,395

(22) Filed: Sep. 1, 1994

(51) Int. Cl.[7] .............................. G06F 17/50; G06G 7/62
(52) U.S. Cl. .............................. 703/15; 703/13; 703/14; 710/305; 716/4; 716/17; 714/724
(58) Field of Search .................................. 364/488, 489, 364/490, 491, 578; 395/275, 250, 500, 24, 23; 307/475; 371/22.3, 22.1; 29/830, 593; 327/108, 308, 77, 51, 199; 326/30, 82, 17, 86

(56) References Cited

U.S. PATENT DOCUMENTS

| | | | | |
|---|---|---|---|---|
| 4,488,354 A | * | 12/1984 | Chan et al. ................ | 364/490 |
| 4,683,384 A | * | 7/1987 | Shibata et al. ............ | 307/475 |
| 4,744,084 A | * | 5/1988 | Beck et al. ................ | 364/578 |
| 4,791,357 A | * | 12/1988 | Hyduke ...................... | 364/578 |
| 4,821,173 A | | 4/1989 | Young et al. | |
| 4,942,317 A | * | 7/1990 | Tanaka et al. ............. | 364/490 |
| 4,978,633 A | * | 12/1990 | Seefeldt et al. ........... | 364/491 |
| 4,980,889 A | * | 12/1990 | DeGuise et al. ........... | 371/22.1 |
| 5,105,373 A | * | 4/1992 | Rumsey et al. ............ | 364/578 |
| 5,166,937 A | | 11/1992 | Blecha, Jr. ................. | 371/22.5 |
| 5,300,835 A | * | 4/1994 | Assar et al. ................ | 307/475 |
| 5,317,698 A | * | 5/1994 | Chan ........................... | 364/491 |
| 5,406,147 A | * | 4/1995 | Coyle et al. ................ | 327/51 |
| 5,426,591 A | | 6/1995 | Ginetti et al. .............. | 364/489 |
| 5,426,739 A | * | 6/1995 | Lin et al. .................... | 395/325 |
| 5,428,750 A | * | 6/1995 | Hsieh et al. ................ | 395/275 |
| 5,452,229 A | * | 9/1995 | Shankar et al. ............ | 364/489 |
| 5,479,123 A | * | 12/1995 | Gist et al. ................... | 327/108 |
| 5,481,484 A | * | 1/1996 | Ogawa et al. .............. | 364/578 |
| 5,535,223 A | * | 7/1996 | Horstmann et al. ........ | 364/489 |
| 5,572,437 A | | 11/1996 | Rostoker et al. ........... | 364/489 |

FOREIGN PATENT DOCUMENTS

JP 4273382 2/1993

OTHER PUBLICATIONS

Chranowska–Jeske et al: Improved I/O pad assignment for sea–of–gates placement algorithm, IEEE, Aug. 1992.*

Nolan et al: The integration of power supply components within standard cell integrated circuits, IEEE, May 1989.*

(List continued on next page.)

Primary Examiner—Jacques H. Louis-Jacques
(74) Attorney, Agent, or Firm—Townsend and Townsend and Crew LLP

(57) ABSTRACT

A design system for modeling bi-directional pad cells, the interaction of internal pull cells/resistors with pad cells of all types, and the interaction of external pull cells/resistors with pad cells of all types. This modeling technique involves the use of three separate pins on each bi-directional pad cell: an input-only pin, an output-only pin, and a resolved pin. The input-only pin reflects the data that is supplied to the pad from external sources. The output-only pin reflects the data that is supplied as output from the pad cell (strong data from the output driver). The resolved pin reflects the combination of the input and the output data that are present, as well as the effect of resistive data supplied by pull-up/down resistors/cells. The output-only and resolved pins are implemented as internal or hidden pins within a pad cell model. These pins are included in the model for the I/O pad cells in a given library. The existing pad pin serves as the input-only pin. The model provides two modes of operation such that the same model can be used for either chip-level or system-level simulations.

4 Claims, 11 Drawing Sheets

OTHER PUBLICATIONS

1990 IEEE international Symposium on Circuits and Systems, May 1, 1990; P. Agrawal et al; "Can Logic Simulators Handle Bidirectionality and Charge Sharing?"; pp. 411–414.

IEEE Design & Test of Computers; vol. 7, No. 3, Jun. 1990; Coelho; "A VHDL Standard Package for Logic Modeling"; pp. 25–32.

IBM Technical Disclosure Bulletin; vol. 30, No. 4; Sep., 1987; Testing Multiple Discrete Software Components by Connecting Real and Simulated Hardware Components; pp. 1844,455.

An Emulator for CMOS ASICS; VLSI Systems Design; May 4, 1987; pp. 8.

* cited by examiner

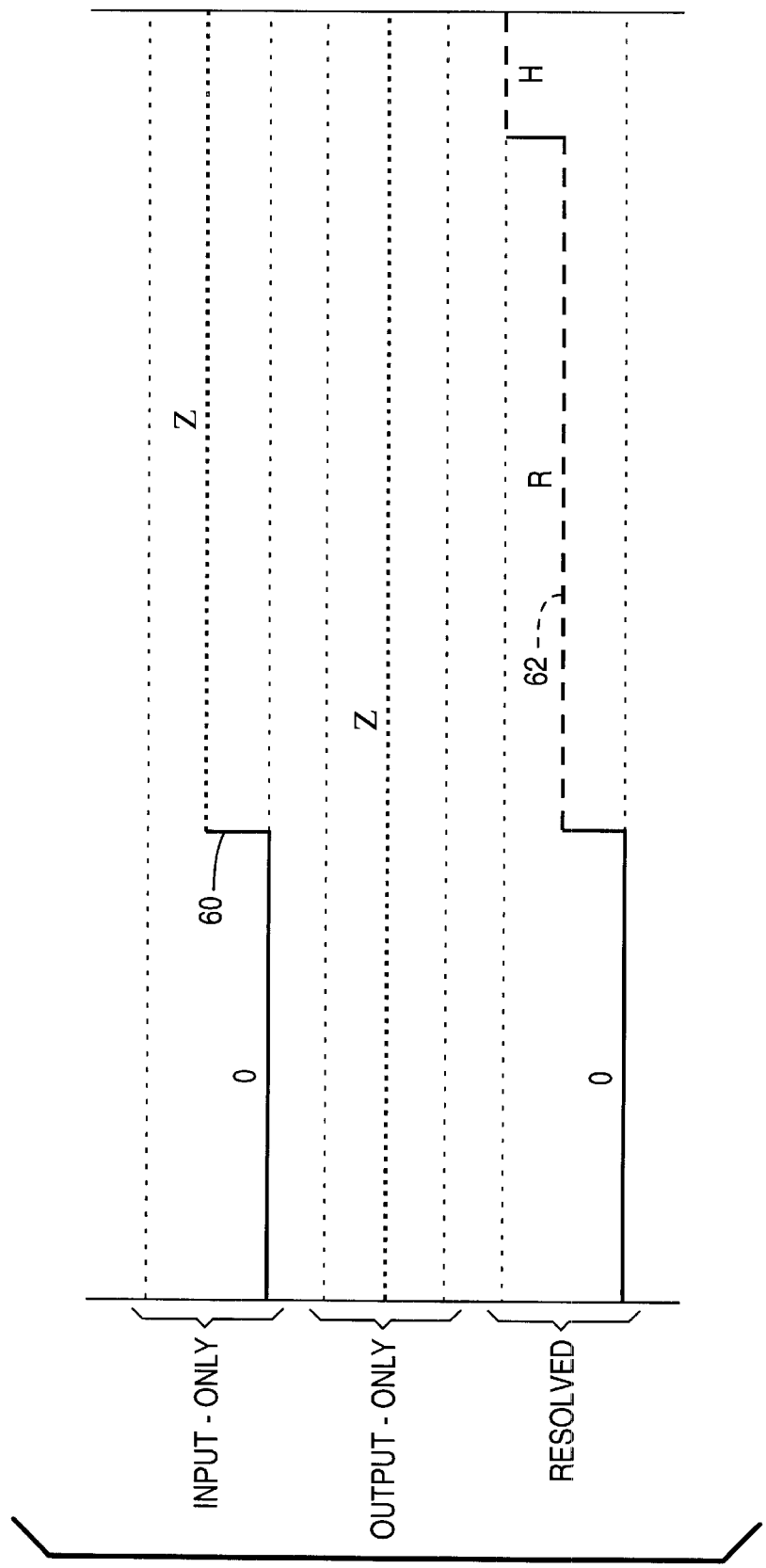

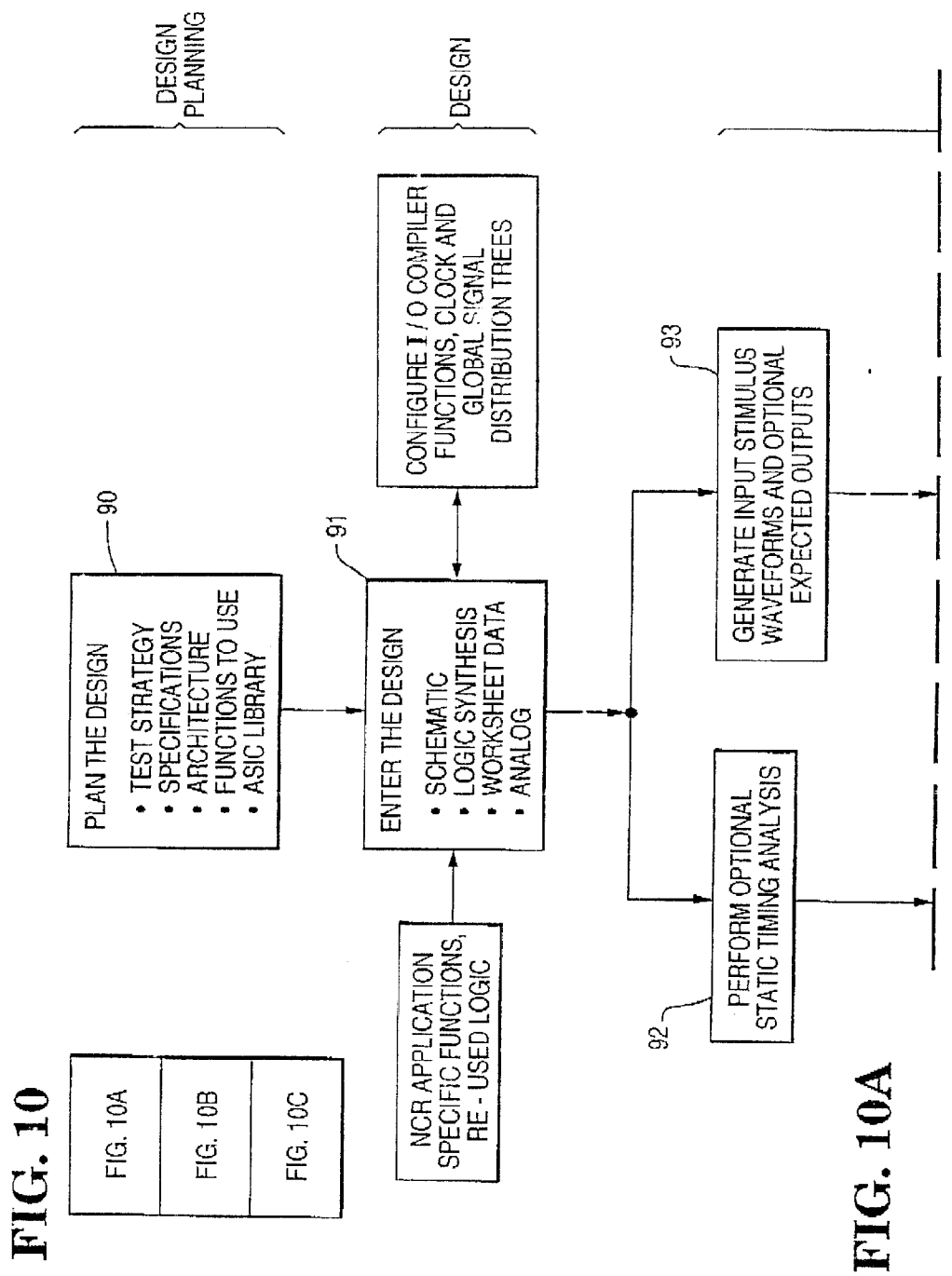

INTEGRATED CIRCUIT I/O PAD CELL MODELING

TECHNICAL FIELD

The present invention relates to modeling of electrical circuit characteristics, and more specifically to modeling of an integrated circuit I/O or bi-directional pad cell.

BACKGROUND OF THE INVENTION

The design of integrated circuits has become increasingly complex as more and more circuits are realizable on a given substrate. This increase in circuit density, and resulting increase in circuit functionality, has resulted in the need for automated circuit design tools. These circuit design tools (hereinafter design test tools) assist a circuit designer in logic entry, simulation and test pattern generation.

Simulation of integrated circuit designs generally rely on models, or other types of information, that the simulator uses to generate signals resulting from some type of circuit stimulus. The relative timings between the stimulus and resulting response are of critical importance as circuits are operated at high speed.

Also of particular importance is how well the simulated responses actually track with the resulting physical implementation of the circuit. This correspondence between predicted and actual responses is important both as to the logical circuit design itself, and to the test patterns that are generated to test the resulting circuit embodiment. Incorrect timings of the logical circuit could result in logical errors being propagated into the physical embodiment of the integrated circuit. Incorrect timings for test patterns could result in test patterns being generated (stimulus and expected response) which don't match the actual circuit responses during test.

The modeling and simulation of integrated circuit input and output (I/O) pins is particularly troublesome, in that due to the bi-directional nature of many I/O pins (such as those driving and receiving signals on a bus), there can be contentions where more than one driver is trying to drive a given I/O signal to a given (and sometimes conflicting) voltage level. When contention situations exist, the simulation results are erroneous, due to the inability to determine which direction the signal is to be propagated (e.g. into the chip, as driven from some external source, or out of the chip, as driven by the chip circuitry itself).

Current methods of utilizing I/O enable signals for direction determination do not provide actual switch point locations, and do not identify when contention is occurring. These limitations are becoming increasingly important for designs which run at higher frequencies and those which require I/O contention situations to exist.

Enhanced modeling of both internal pull cells and external pull resistors is necessary to improve simulation accuracy as well as to insure that design test tools can extract appropriate test vectors for signals which utilize pull cells/resistors. Incomplete and/or inaccurate pull-up/down information can result in incorrect simulation functionality as well as misplaced strobing (i.e. checking the value) of resistive states. These issues have repeatedly caused manufacturing test problems over the past several years.

Using the combination of the I/O enable signal and the resolved I/O signal for design analysis does not provide enough information to properly handle mid-cycle I/O capabilities and contention situations.

In the case of resistive state modeling, current techniques provide less than accurate simulation information. In some cases, this type of inaccuracy compromises the correctness of the design functionality exhibited during simulation. It also makes strobing of resistive states difficult during manufacturing tests.

SUMMARY OF THE INVENTION

It is an object of the present invention to provide an improved circuit model for simulation of electrical circuits.

It is another object of the present invention to provide an improved I/O pad cell model for use by a simulator.

It is yet another object of the present invention to provide accurate timing information in the generation of test patterns for an integrated circuit.

A design system for modeling bi-directional pad cells, the interaction of internal pull cells/resistors with pad cells, and the interaction of external pull cells/resistors with pad cells is provided. A new modeling technique, referred to herein as split-I/O modeling, involves the use of three separate pins on each bi-directional pad cell model: an input-only pin, an output-only pin, and a resolved pin. The input-only pin reflects the data that is supplied to the pad from external sources (strong data that is forced in). The output-only pin reflects the data that is supplied as output from the pad cell (strong data from the output driver). The resolved pin reflects the combination of the input and the output data that are present, as well as the effect of resistive data supplied by pull-up/down resistors/cells (i.e. the resistive state).

The output-only and resolved pins are implemented as internal or hidden pins within a pad cell model. These pins are included in the model for the I/O pad cells in a given library. These pins are named O_ONLY (the output-only pin) and RESOLVED (the resolved pin). The existing pad pin serves as the input-only pin. The system is able to instruct the simulator to log the internal signals through the use of the occurrence name for each I/O pad cell.

The split I/O model provides two modes of operation such that the same model can be used for either chip-level or system-level simulations.

BRIEF DESCRIPTION OF THE DRAWING

FIG. 6 shows the resulting waveform for the I/O pad of FIG. 5.

FIG. 10, including FIGS. 10A–10C, shows a design methodology for designing and fabricating integrated circuit devices.

DETAILED DESCRIPTION OF THE PREFERRED EMBODIMENT

In the design of integrated circuits, including application specific integrated circuits (ASICs), there are numerous types of design test tools available to assist the logic designer in logic entry, simulation, layout, test pattern generation, etc. These tools are well known in the art. The present invention is a model used to represent a particular portion of an integrated circuit design, specifically the I/O pad cell. This model is used in conjunction with a simulator to synthesize the behavior of an actual I/O pad cell when embodied as part of a resulting integrated circuit.

Figure 10B:
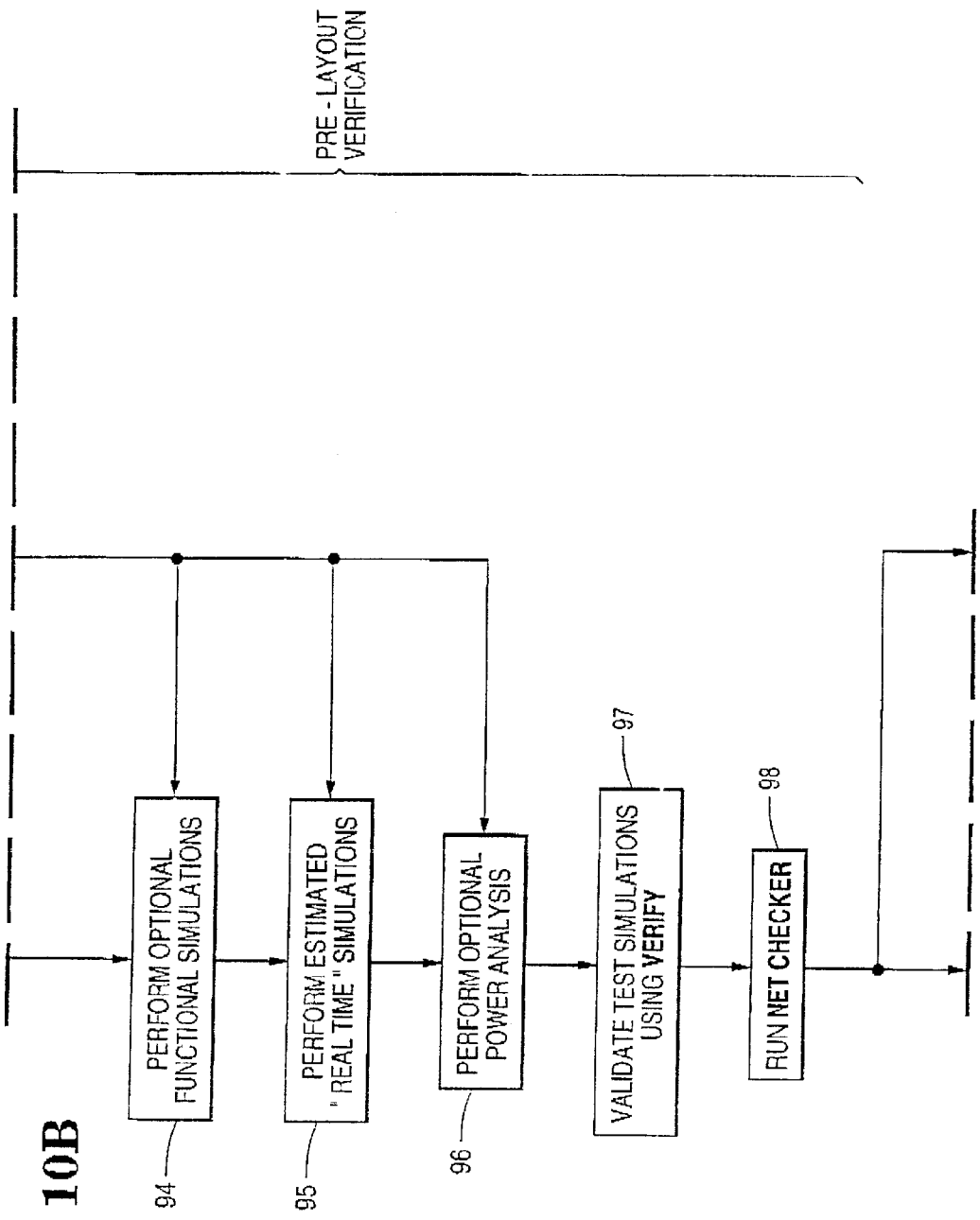
Figure 10C:
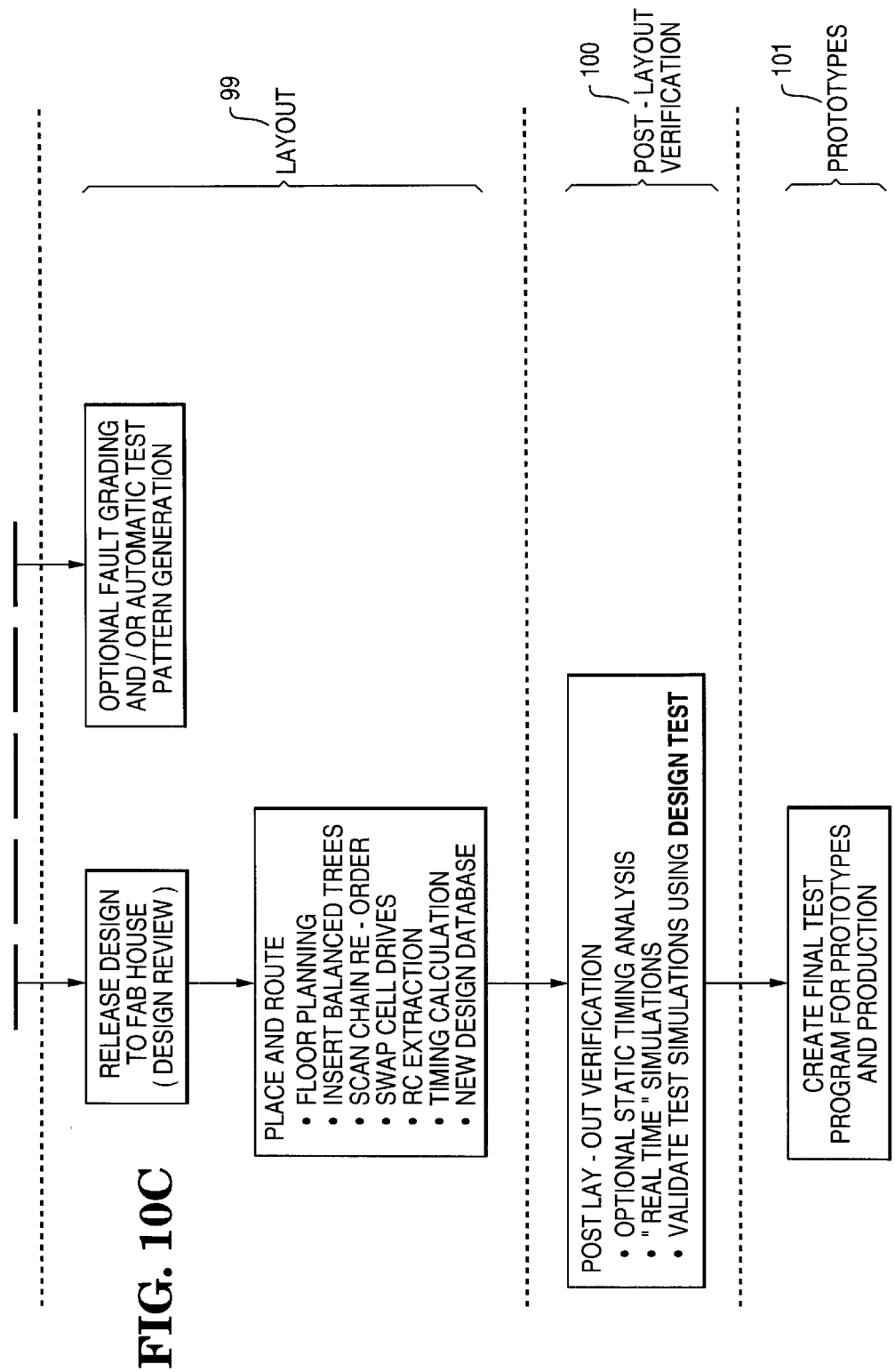

FIG. 10, including FIGS. 10A–C, shows a typical design methodology for designing integrated circuits, and in particular for designing ASICs. First, initial planning of the design is done at 90. The design is then entered at 91 using standard CAE/CAD tools known in the industry, such as those from Cadence Design Systems, Mentor Graphics, Synopsis and Viewlogic. Part of logic entry includes compiling the pad cells, using an I/O compiler such as the VS500 I/O Compiler, available from AT&T Global Information Solutions Company, Microelectronics Division located in Ft. Collins, Colo. (hereinafter AT&T MPD). After design entry, the user can optionally perform static timing analysis at 92 (using a tool such as VeriTime, available from Cadence Design Systems, Inc. which is located in San Jose, Calif.), as well as generate input stimulus waveforms at 93 for use in subsequent simulation (using a tool such as Wisil, also available from AT&T MPD). After such stimulus waveform creation, the user can optionally perform functional simulations at 94. The user then performs real time simulation at 95 using the same simulator. These simulation steps are where the present invention is utilized. The particular model detailed herein was written for use with the Verilog simulator, such simulator being available from Cadence Design Systems. After simulation, power analysis can optionally be performed at 96 using a PowerCalc tool, available from AT&T MPD. The simulation results are then validated at 97, preferably with the Verify design test tool (also available from AT&T MPD). A net checking tool called NetChecker (also available from AT&T MPD) can then be run at 98. The layout 99, post-layout verification 100 and prototype 101 phases shown in FIG. 10C are standard in the industry, and are not important to the understanding of the present invention described herein.

As mentioned above, logic simulators are commonly known in the industry, and such simulators are provided by companies such as Viewlogic, Cadence, Mentor Graphics, Zycad and Ikos. These simulators not only provide for device-level simulation, but also allow for behavior-model simulation. With behavior-model simulation, a particular subset of the integrated circuit to be simulated is replaced with a programming model that generates output responses to various input stimuli.

The split I/O pad cell model described herein adheres to standard behavior-model interface protocols/programming interfaces known in the industry. Accordingly, the design techniques used for the model itself will be described herein, with the specific implementation for the Verilog simulator being listed thereafter. It is a matter of routine coding to adhere to the techniques described herein to generate specific models for other types of simulators.

In the following discussions, logic states will be referred to by the appropriate state characters. The list of state characters that are used, and the logic state/strength combination that they represent, are shown in Table 1.

TABLE 1

State Characters

| State Character | Logic Level | Strength |
|---|---|---|
| 0 | low | strong |
| 1 | high | strong |
| X | unknown | strong |
| L | low | resistive |
| H | high | resistive |
| R | unknown | resistive |
| Z | unknown | high-impedance |

Waveform diagrams are used to provide examples of the desired model behavior. Table 2 shows the types of lines used in the waveform diagrams to represent each of the different strengths.

TABLE 2

Waveform Strengths

| | |
|---|---|
| strong | ———— |
| resistive | - - - - - |
| high-impedance | · · · · · · · · · |

Figure 1:
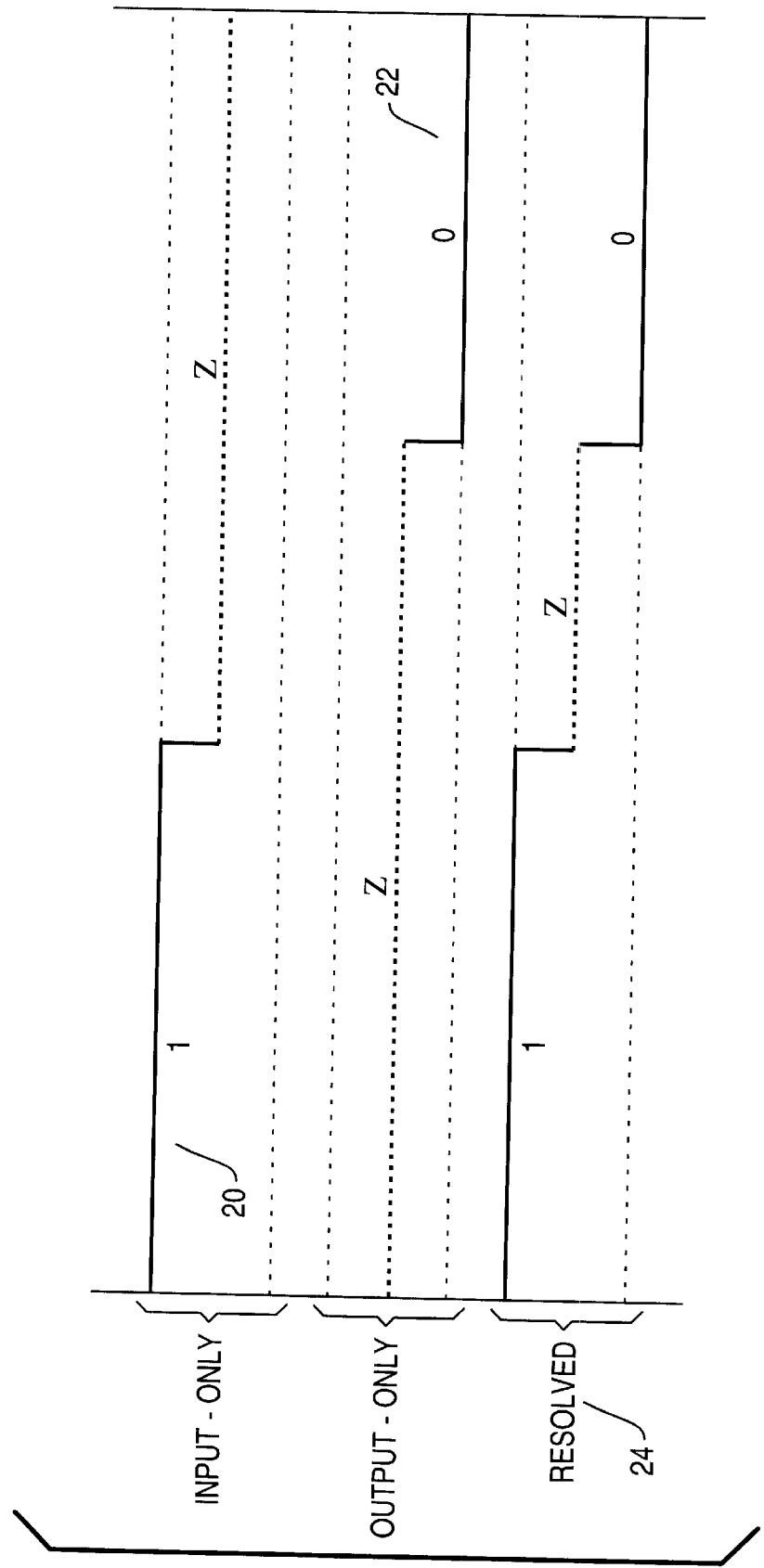
FIG. 1 shows sample bi-directional waveforms.

To illustrate the signals present on the input-only, output-only, and resolved pins, consider the waveforms in FIG. 1. This example shows a situation where the I/O pin is first in input mode, as indicated at 20, with a logic one being driven from an external source. The I/O then switches to an output mode, as indicated at 22, with a logic zero then being driven from the pad cell. The resolved signal is the resulting signal value as determined by the simulator, based upon the input-only and output-only signals. An enable signal (not shown) is 'active' during the region 22 of outputting data, and 'inactive' during the region 20 of inputting data. Note that in this example, use of the I/O enable signal in combination with the resolved signal 24 would have been sufficient to determine which portion of the resolved waveform represented input data and which represented output data.

Figure 2:
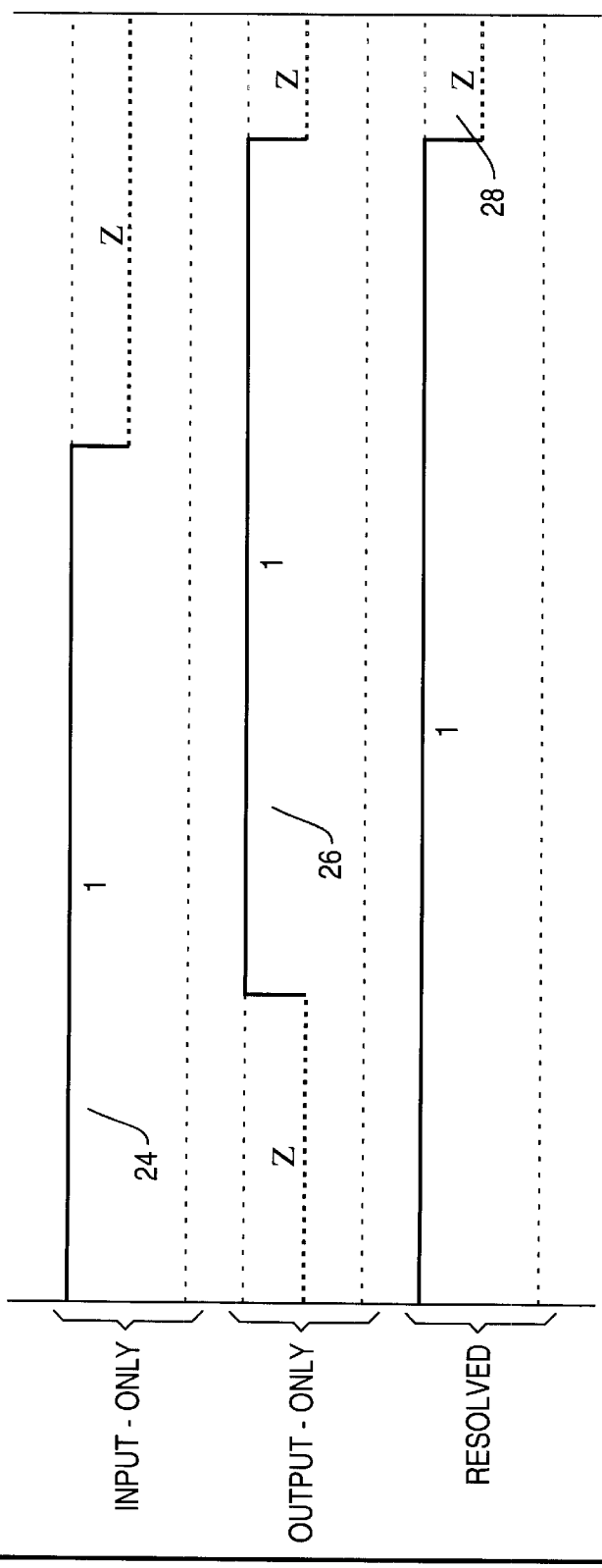
FIG. 2 shows an example of I/O contention.

However, consider the waveforms shown in FIG. 2. This example shows an I/O contention situation which illustrates the need for using the input-only and output-only signals. Initially, the I/O pin is in input mode, as shown at 24, with a logic one being driven by an external source. Then, the I/O switches to an output mode, as shown at 26, with a logic one being driven by the pad cell. This results in a contention situation, as both the input and output signals are attempting to drive the signal to a logic one. The resolved signal does not reflect the turning on of the output signal, and remains at a logic one until both the input and output are at high impedance, as indicated at 28.

While, in this case, the use of an I/O enable signal would provide an approximate indication of the time at which the output turned on and off, it would not indicate the precise turn-on and turn-off times, due to an internal delay between the time the enable signal is detected by input circuitry and the time the resulting output signal is actually asserted. When dealing with low speed designs, the delay between the I/O enable transition and the actual turn-on/off times is negligible. However, for high speed circuits it becomes significant: the exact location of the I/O switch point must be determined. The output-only signal provides this exact information concerning the turn-on/off points. This is why use of the output-only signal is necessary.

As mentioned above, use of an I/O enable signal provides some indication of the output turn-on/off times. And, the output-only signal completes the picture of the data that is provided by the I/O pad cell itself. However, neither the I/O enable signal, output-only signal, or the resolved signal provide an indication of the time at which the input data turned off. Since the tester must be programmed to produce the input waveform that was applied as stimulus during simulation, the design test tools need to determine the exact input waveform that was applied. More information is needed to make this determination. The input-only signal provides this information. This is why use of the input-only signal is necessary.

While the input-only and output-only signals will provide the design test tools with sufficient information to both determine directionality and determine turn-on/off times, only the resolved signal contains information regarding the signal that results from mixing the input-only signal, the output-only signal, internal pull cells (if any) and external pull resistors (if any). Since the resolved signal is the only signal that properly reflects the contribution of the resistive components, it must also be provided in each I/O pad cell model to allow the design test tools to have a complete picture of the state of the bi-directional signal. As a result, the input-only, output-only and resolved signals are included in the simulation output file for each bi-directional pad cell in the design.

The bi-directional pad cell models operate in two modes: tester-compatible mode and system simulation mode. The simsetup files' TESTER_EMULATION keyword is used to select which mode is in use for a particular simulation. It should be noted that some simulators require the TESTER_EMULATION keyword to be entered as a parameter on the command line when invoking the simulator. Setting TESTER_EMULATION on (either by simsetup file or command invocation parameter) will imply use of the tester-compatible mode. In tester-compatible mode, the three pins of the bi-directional pad cell model provide the information described above. In system simulation mode, the isolation between the input-only and the resolved signal is removed and these two signals are equivalent. This is necessary since other components may need to be connected to the pad pin (the input-only signal) in system simulations. This signal not only reflects what is going into the pad, but also reflects the output so that the other component(s) connected to the pad can react to the pad's output. Because of this, simulation results that are generated in system simulation mode may not be used to generate test patterns for manufacturing test purposes. It should be noted that the term 'reflect' as used herein means 'to show' or 'to bring or cast as a result', and does not mean 'to throw back light or sound' (see e.g. Webster's New Collegiate Dictionary).

As mentioned earlier, each bi-directional pad cell model in each library provides the three required signals. The following sections describe two types of implementations. Note that in both cases, the output-only (O_ONLY) and the resolved (RESOLVED) pins are implemented as internal pins that cannot be connected to other signals in the design.

As described above, there are two new signals that are required in every I/O pad cell in the cell libraries: an input-only signal and an output-only signal. These new signals are obtained by adding new components to existing cell models known in the art. The preferred libraries containing cell models are the VS500 library and non-VS500 libraries, both of which are available from AT&T MPD.

Figure 3:
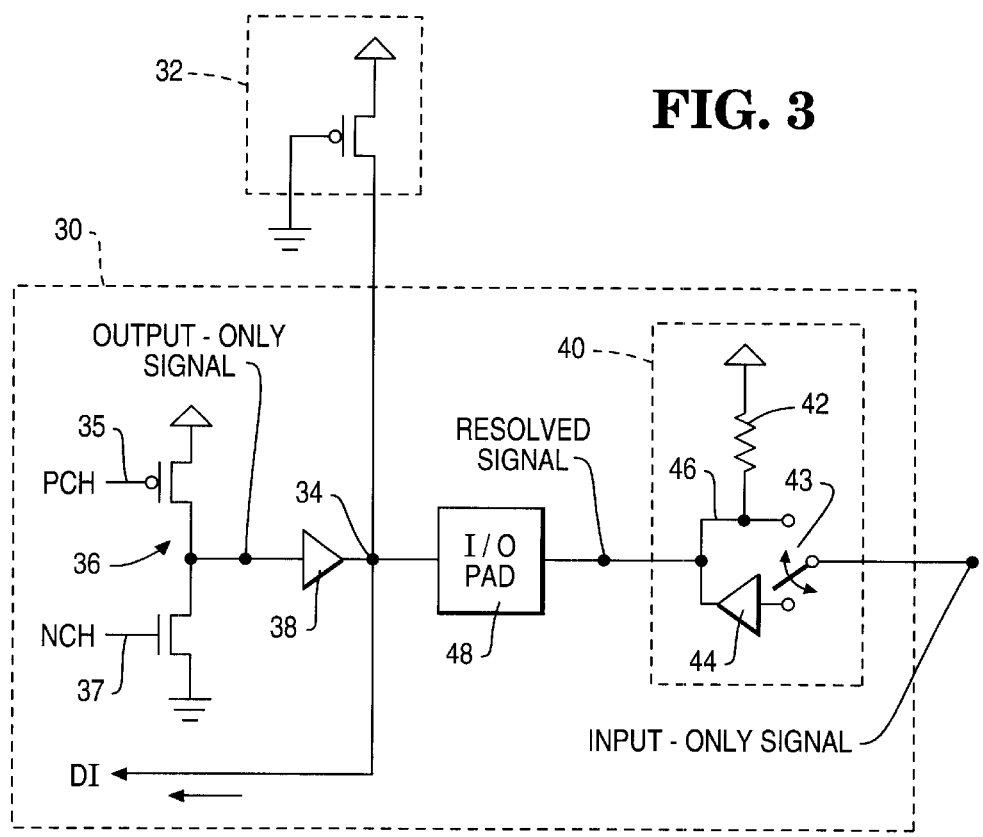
FIG. 3 shows a modified bi-directional pad and pull-up combination.

In the non-VS500 libraries, all of the circuitry was added within the bi-directional pad cells themselves. FIG. 3 shows a modified pad cell 30 in combination with an internal pull-up cell 32. Note that the internal pull-up 32 is completely optional, but is shown here to clarify that its connection 34 to the I/O pad cell is isolated from the output driver 36 by an isolation buffer 38 that has been added to the pad cell model (the isolation buffer does not actually exist in silicon). It should also be noted that although the example only shows one particular I/O pad cell in the non-VS500 libraries, the changes are applicable to all I/O pad cells in the non-VS500 library.

The existing I/O pad cell, prior to modification, comprises a stacked p-channel and n-channel transistor pair output driver 36, and an I/O pad 48. Elements 38 and 40 within the pad cell 30 indicate new circuitry that has been added. The circuitry 38 is an isolation buffer which insures that the output-only signal is not affected by any input to the cell other than from the PCH/NCH pins 35 and 37. The receiver circuitry 40 is more complex. It contains an optional external pull-up resistor 42 whose presence and strength are controlled through keywords in the simsetup file (see Table 3 below). It also contains some switchable circuitry 43 that is controlled by the TESTER_EMULATION keyword in the simsetup file. The switchable circuitry selects either to isolate the input-only signal (switch down), or to directly connect the input-only signal to the resolved signal (switch up). In tester-compatible mode, the buffer 44 is used to isolate the input-only signal from the resolved signal. In system simulation mode, the wire 46 connects the input-only signal directly to the resolved signal to let data flow in both directions.

Figure 4:
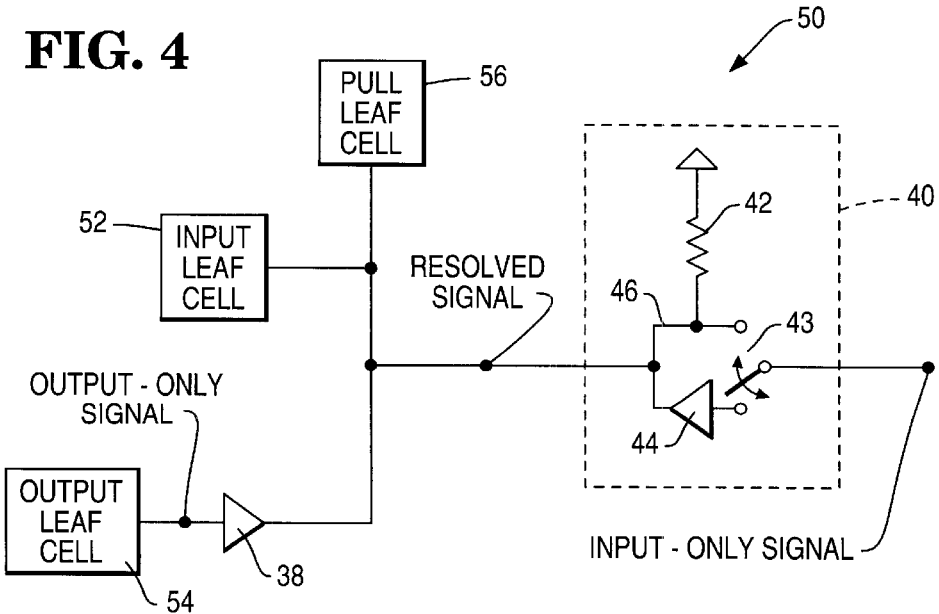
FIG. 4 shows an alternate bi-directional pad with pull leaf cell.

FIG. 4 shows a second implementation, where a second type of bi-directional pad macro (from the VS500 library) was modified to provide the required signals. This second implementation has leaf cells which are connected by the I/O compiler to create bi-directional pad macros 50. There are an input leaf cell 52 and an output leaf cell 54. A pull leaf cell 56 is added if an internal pull-up, pull-down, or keeper is desired.

As in the first implementation, elements 38 and 40 are new circuitry that has been added. Elements 38 and 40 are the same as previously described with respect to FIG. 3. The I/O compiler is responsible for adding this circuitry between the leaf cells as it creates the pad macro using the fixed signal names of O_ONLY for the output-only signal and RESOLVED for the resolved signal.

Internal pull resistor modeling will now be described. For purposes of this description, internal pull resistors are the pull-up and pull-down cells that can be connected to a pad cell and which lie inside the integrated circuit (IC), such as elements 32 of FIG. 3 and 56 of FIG. 4. The interaction between these cells and the pad cells to which they are connected has been a problem area in the past.

Figure 5:
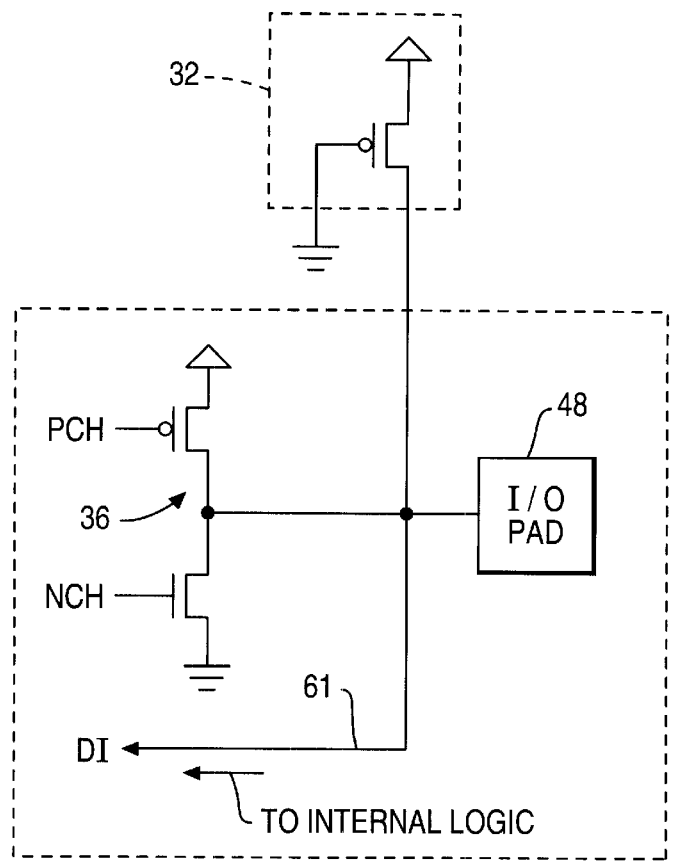
FIG. 5 shows an I/O pad with internal pull-up.

Situations have existed which allowed a signal to transition instantaneously from a strong state to a resistive state of the opposite polarity (to transition, for example, from a strong logic zero state to a resistive logic one state). This behavior is not realistic and can cause two problems: incorrect input into the device and incorrect output from the device. Each of these problems is discussed in more detail below. The combination of an I/O pad cell with an internal pull-up cell is used to illustrate these problems. This configuration is shown in FIG. 5.

The issue of incorrect input data applies only to input and bi-directional signals. To understand the potential problems that can arise, consider the following situation regarding the circuit of FIG. 5 and related timing diagram of FIG. 6. If a strong logic zero state is being applied as input to the I/O pad 48 and is then taken away, the stimulus entering the pad transitions from a strong logic zero to a high-impedance state, as shown at 60 of FIG. 6. The internal pull-up 32 (which, in this circuit, is always enabled) will then begin to pull the signal to a resistive logic one state. However, this will take a finite amount of time depending on the strength of the pull-up and the clock rate of the device. It could take as much as several clock cycles.

Assuming that the output side of the I/O pad is disabled throughout this time, the data that is present on the DI pin 61 of the I/O pad is in transition from logic zero to logic one. Since the data on the DI pin is potentially controlling internal logic, this transition must be modeled accurately. If it appears to reach a logic one state too early, the device's performance during simulation may differ from the actual performance of the resulting fabricated IC. Therefore, the model takes into account the strength of the pull resistor 32, as well as the capacitive loading of the I/O pad 48, to determine the transition time. For external pull resistors, both the pull resistor cell's strength (in terms of current source/sink) and the capacitive load value for each pin are available in the simsetup file and are used during simulation for the necessary calculations. This applies to any transition from a strong state to a resistive state of the opposite polarity. FIG. 6 shows the waveforms which are produced on the pad cell's signals in this situation.

Since it is not possible to model the actual waveform which is produced by this type of transition, a suitable approximation is necessary. To insure that the data is not utilized as valid input data during the transition region, it is necessary to model this portion of the waveform as having an unknown level. And, since any strong data that is driven onto the pad during the transition region—either as input to the pad or output from the pad—should take precedence over this transitioning resistive data, it must have a resistive strength. For these reasons, a resistive unknown state (the format state 'R') is used, as shown at 62 of FIG. 6.

The issue of incorrect output data coming out of the device applies only to output and bi-directional signals. The configuration shown in FIG. 5 and utilized in the previous section can also be used to illustrate this type of problem. If the transition from a strong logic zero state to a resistive logic one state occurs instantaneously, it will appear to the design test tools as though the resistive data is available for strobing immediately. The resulting test vectors could then potentially attempt to strobe this resistive data while it is still in transition (as mentioned earlier, the transition could actually span several clock cycles). When this occurs, the device will fail during test. The test engineer must manually remove the strobing from the test vectors for each such occurrence. This type of manual effort is time consuming and must be avoided. The use of the 'R' state 62 during the transition region, as shown in FIG. 6, will prevent strobing from occurring before the transition is complete.

Figure 7:
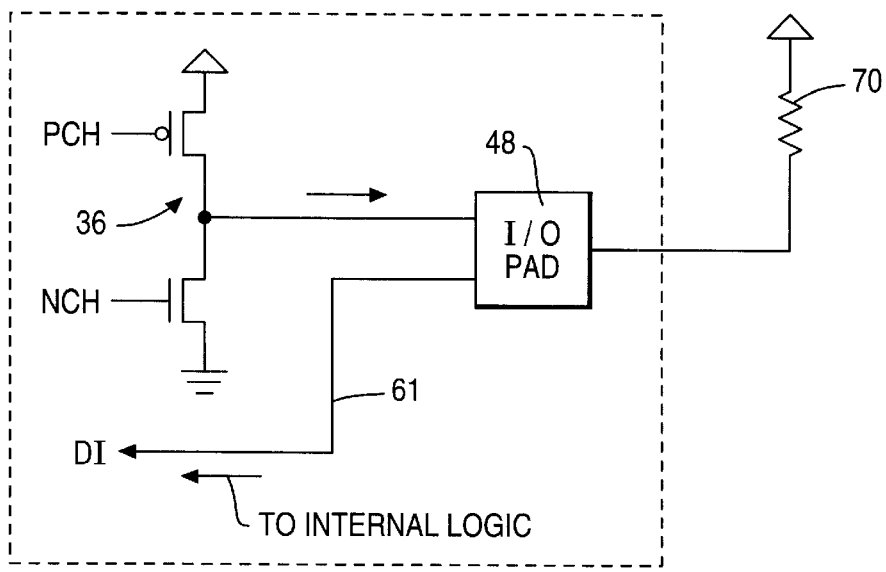
FIG. 7 shows an I/O pad with external pull-up.

External pull-up resistor modeling will now be described. For purposes of this description, an external pull-up resistor is one that is connected to a pad cell but which lies outside the IC (as previously noted, these external pull-ups will now be part of the pad cell/macro model), such as element 70 of FIG. 7. The interaction between these external resistors and the pad cells to which they are connected has been a problem area in the past. As with the case of internal pull cells, situations have existed that allowed a signal to transition instantaneously from a strong state to a resistive state of the opposite polarity. This behavior is not realistic and can cause the same two problems that were previously described for internal pull cells. The following discussions use the combination of an I/O pad cell with an external pull-up resistor to illustrate these problems. This configuration is shown in FIG. 7.

The situations previously cited apply as well to external pull-up resistors as they do to internal pull cells. Therefore, the modeling of these situations must be almost identical to the modeling previously prescribed regarding internal pull transistors. The main difference is that the presence and strength of the external pull-up 70 is controlled entirely through keyword(s) in the simsetup file, as shown below in Table 3.

Figure 8:
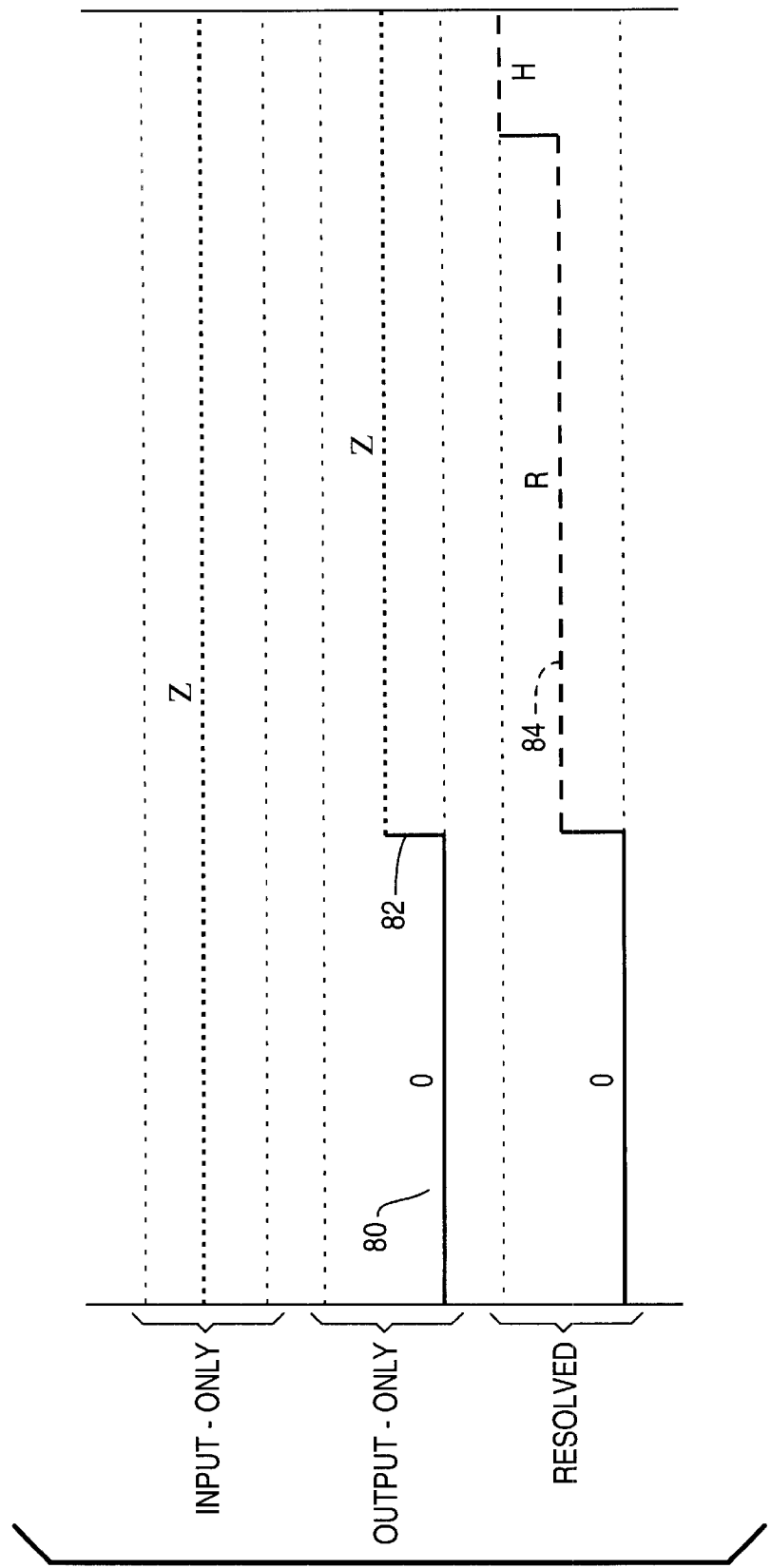
FIG. 8 shows the resulting waveform for the I/O pad of FIG. 7.

As an example of this situation, consider the waveforms shown in FIG. 8. These waveforms begin with the I/O pad's output enabled and driving a strong logic zero state at 80. When the output turns off at 82, the resistive data from the external pull-up begins to pull the pad to a resistive logic one state at 84. These waveforms show the desired modeling where the resolved state passes through the 'R' state. Again, the transition time is calculated by the model using the strength of the pull resistor and the capacitive loading on the pad.

Figure 9:
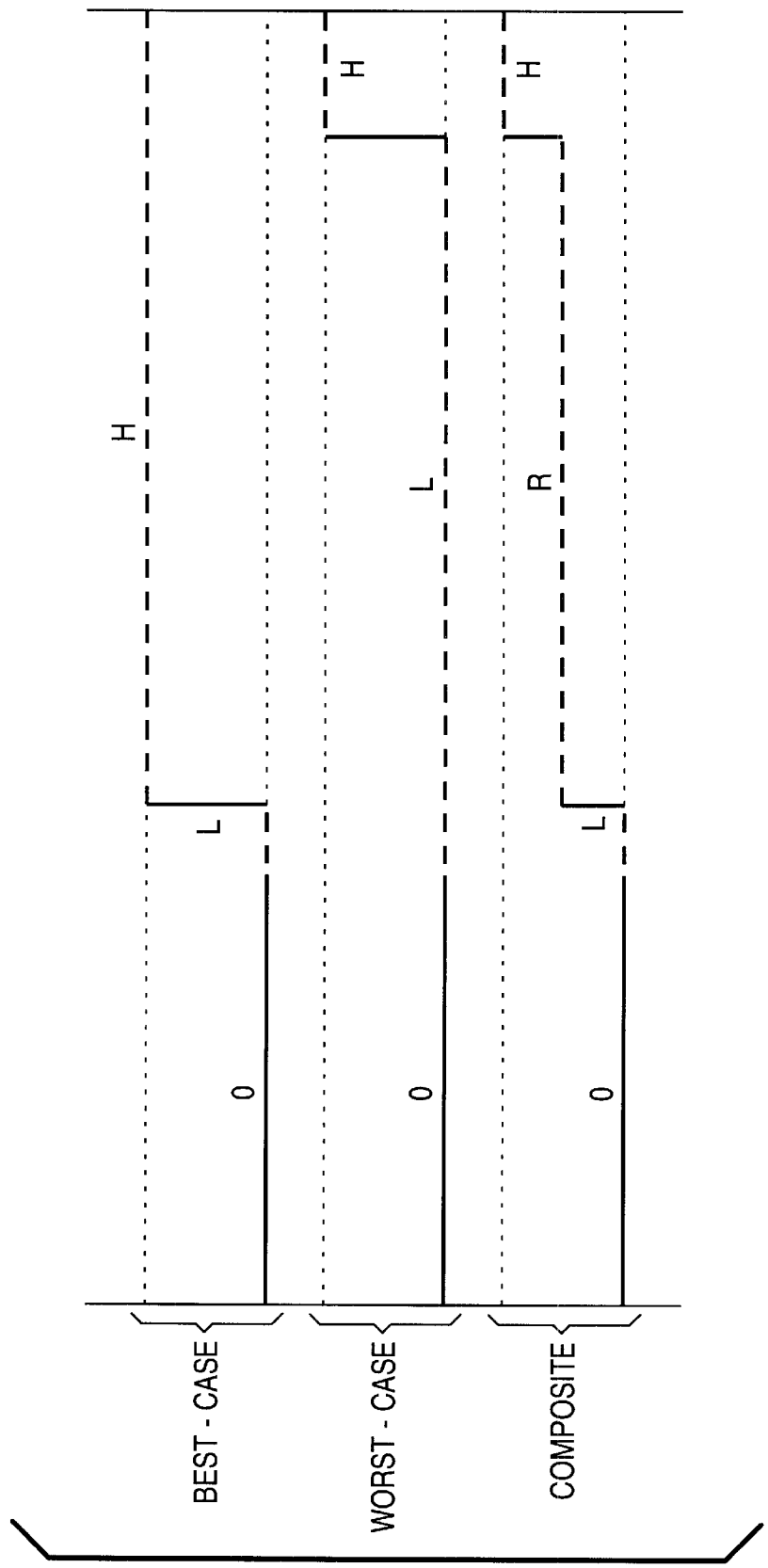
FIG. 9 shows a waveform for resistive state modeling for a SCSI pad cell.

The following describes several special case situations which deserve additional discussion:

1) In some cases, SCSI (which stands for small-computer standard interface, and which is a commonly known industry standard) pad cells are used to drive clock signals which are unable to tolerate unknown input states. For this reason, the modeling of resistive states in connection to SCSI pad cells should be slightly different from that of other I/O pad cells. In order to avoid using a resistive unknown (R) state on these signals, a technique is used which avoids the unknown state usage while insuring that simulation functionality and strobe placements for test purposes are not adversely affected. This technique involves utilizing resistive high (H) and low (L) states in place of the resistive unknowns, as shown in FIG. 9.

Note that the pull-up times vary greatly between the best- and worst-case simulations. Both simulations show the signal transitioning from a strong logic zero state to a resistive logic zero state L as the output driver turns off. For best-case, the signal transitions to a pulled-up state H one simulation tick later. For worst-case, the signal stays at a resistive logic zero state until the maximum pull-up delay time (calculated using the pull-up strength and the pin's capacitive load). In a composite simulation (i.e. where the best case and worst case timings are merged into a single simulation), the resulting waveform will be such that the signal will transition to a resistive logic zero state L for one tick, then to a resistive unknown state R for the time up to the point where the signal reaches a resistive logic one state H at the worst-case pull-up time.

2) In the past, open drain configurations were treated as special cases. In certain situations, a pull-up was assumed to be used in combination with open drain cells even if no pull-up was present in the schematic. However, in many cases, "normal" output and I/O cells could be configured as open drain cells by the user. These cells would not make the same pull-up assumptions as the open drain cells. To avoid this situation, and to insure that all of the output and I/O pad cells model resistive states consistently, it is preferable to eliminate this type of assumption. If a pull-up is desired, it will have to be specified by the user (i.e. internal pull-up cells must be present in the schematic and external pull-up resistors must be specified in the simsetup file). This provides the user with complete control over whether resistive states occur on open drain signals during simulation.

3) The situation where the internal pull cell's enable signal is toggled during simulation is considered a special case. Whenever the pull cell becomes enabled, the model considers the current state of the resolved I/O signal to determine the proper action. If the resolved signal is already at the same logic level that the pull cell is tied to (logic one for pull-ups; logic zero for pull-downs), the output of the pull cell attains the resistive state at that level instantaneously. If the resolved signal is at a strong state of the opposite polarity (logic zero for pull-ups; logic one for pull-downs), or if it is at a strong unknown state, the pull cell passes through the resistive unknown ('R') state for the calculated transition time on its way to the resistive state of the opposite level (in a manner similar to that shown for the composite signal of FIG. 9).

4) It is possible for the user to specify that both a pull-up and a pull-down exist on the same pad (these may be a combination of internal and external). If both the pull-up and pull-down are enabled at the same time, and there is no strong signal present during this time, the resulting resolved state is a resistive unknown ('R') even if one pull cell is stronger than the other.

The following describes several impacts to users of the split I/O model:

1) Users of bi-directional signals are affected by the split-I/O technique. The worst-case effect is that their simulation output includes the input-only and output-only signals for each bi-directional pad cell occurrence in addition to the resolved signal. Each of these signals is utilized by the design test tools in analyzing the simulation results. The I/O enable signal is no longer needed to be included in the simulation output.

2) Any user of internal pull cells or external pull-up resistors is also affected by the modeling changes regarding generated resistive state output values. This will occur regardless of whether the pull cell/resistor is used in conjunction with input, output, or I/O pads—the modeling changes will affect each type of pad. However, the use of pull cells/resistors will not require any changes to the way the user performs the simulations. Users of external pull-up resistors are required to specify, in the simsetup file, which pads are connected to an external resistor and the strength (current sink/source rating) of the pull resistor. For libraries which support mixed voltages, the user is also required to specify the voltage level to which the external pull-up is connected. Examples of this are shown below in Table 3.

The simulation setup (simsetup) file of Table 3 is a representative file which specifies various parameters and configurations for use with simulation.

TABLE 3

```
# This sim.setup file created by 'ncr_setup'
# Version 11.0.0_1.5.0
#------------------------------------------------------
#------------------------------------------------------
# ASIC Specific Information
#------------------------------------------------------
DESIGN_NAME                   my_design
TECHNOLOGY                    vs500
CHIP_VOLTAGE                  5.0_only
BOUNDARY_SCAN                 false
#------------------------------------------------------
# Delay Information
#------------------------------------------------------
#-----------------------------
# Best case operating point
#-----------------------------
BEST_VPT_NAME                 best
BEST_TEMP                     0
BEST_VOLT                     5.5
BEST_PROC                     b
BEST_PARASITIC                b
#-----------------------------
```

TABLE 3-continued

```
# Typical case operating point
#-----------------------------
TYPICAL_VPT_NAME              typical #OFF
TYPICAL_TEMP                  25
TYPICAL_VOLT                  5.0
TYPICAL_PROC                  t
TYPICAL_PARASITIC             t
#-----------------------------
# Worst case operating point
#-----------------------------
WORST_VPT_NAME                worst
WORST_TEMP                    70
WORST_VOLT                    4.5
WORST_PROC                    w
WORST_PARASITIC               w
#------------------------------------------------------
# Pull-Up Information
#------------------------------------------------------
# The following three lines define default pullup. If an
# external pullup is not specified [ in sim.setup] for an OPEN # DRAIN,
the default values will be used.
DEFAULT_EXTERNAL_LOAD         30.0
DEFAULT_PULLUP_CURRENT        0.0
DEFAULT_PULLUP_VOLTAGE        5
# The following three keywords (PULLUP_CURRENT,
# PULLUP_VOLTAGE, and EXTERNAL_LOAD) are used to specify
# the rise time of the external pullup. In the example above, a
# PAD is given a pullup that supplies 0.5 ma at 5 volts. PAD
# is loaded with 30.0 pf.
PULLUP_CURRENT PAD            0.5
PULLUP_VOLTAGE PAD            5
EXTERNAL_LOAD PAD             30.0
#------------------------------------------------------
# Library Information
#------------------------------------------------------
VITA_DATA_PATH       .:/usr/local/ncr/MG_11.0.4/data_files/vs500
VITA_HEADER
/usr/local/ncr/MG_11.0.4/data_files/vs500/vs500.vt5.head
CELLCAP_DATA
/usr/local/ncr/MG_11.0.4/data_files/vs500_DLM.cellcap
#------------------------------------------------------
# Output Files Placed in 'DESIGN_NAME/NCR_DESIGN' directory
#------------------------------------------------------
NCR_DESIGN_DIR       ncr_design
#------------------------------------------------------
# Cellcount output file:        my_design.cellcount
# Critpath output file:         my_design.critpath
# DVE output file:              my_design.dve_setup
# Netchecker output file:       my_design.netchecker
# Design Vita file:             my_design.vt5
# Node5rc output file:          my_design.ndr
# Port Occurrence file:         my_design.portoccs
#------------------------------------------------------
#------------------------------------------------------
# Global Information
#------------------------------------------------------
CELLCOUNT                     off  #Does ncr_presim run
                                   ncr_cellcount?
NETCHECKER                    off  #Does ncr_presim run
                                   ncr_netchecker?
NODE5RC                       off  #Does ncr_presim run
                                   ncr_node5rc?
SYNCRP_X_OUTPUTS              on
POR_DELAY                     0.0  #Specify in nanoseconds
ESTIMATED_GATE_COUNT          0
ST_MARGIN                     0.0  #Specify in nanoseconds
HT_MARGIN                     0.0  #Specify in nanoseconds
RT_MARGIN                     0.0  #Specify in nanoseconds
MPW_MARGIN                    0.0  #Specify in nanoseconds
TESTER_EMULATION                   #Specifying this keyword
                                   turns tester_emul on
# Input Signal Information
DEFAULT_INPUT_RISE            5.0
DEFAULT_INPUT_FALL            5.0
# Output Signal Information
DEFAULT_MODULE_LOAD           0.0
#SKEW                         0.0
#BA_FILE_LIST                      # Colon separated list
```

The handling of external pullup information in the simsetup file warrants further discussion. The strength of the pullup is specified in the simsetup file, using the pullup_current and pullup_voltage keywords as shown above in Table 3. If an external pullup is not specified or is given a strength of zero, and the cell is not an open drain, the effect is to remove the pullup. If the cell is an open drain, then the split I/O model uses the default_current and default_voltage if the pullup_current and pullup_voltage are not specified (the only way to remove the external pullup from the open drain is to specify a pullup_current or voltage as 0). The pullup delays are calculated by Node5RC.

Node5RC calculates the delay for the external pullup using the following formula. This formula calculates the rise time from 0 to 1.5 volts (threshold) using a resistive model. The Refvoltage and PullupCurrent are specified in the simsetup file using the pullup_voltage and pullup_current keywords.

TABLE 4

External Pullup Delay Calculation $$tp = -\left(\log\left(1 - \frac{1.5}{Re\ fVoltage}\right) \cdot \frac{Re\ fVoltage}{PullupCurrent} \cdot ExternalLoad \cdot 1000\right)$$

The following code listing in Table 5 is the split I/O model software code that is operational with a VeriLog simulator. Other types of simulators may be used by adhering to the underlying principles and techniques of this code, and description hereinabove, to the particular behavioral programming language required for those particular simulators.

TABLE 5

Split I/O Pad Model Code Listing

```
//***********************************************************
//Copyright © AT&T Global Information Solutions 1994
module B0C1S310C1IC(A,ENB,PAD,Z);
output Z;
inout PAD;
inputA, ENB;
J0C1S0000000 IPAD(.PAD(RESOLVED), .Z(Z));
  /*Input - FIG. 4 #52 */
U0000000C1IC OPAD(.A(A), .ENB(ENB), .PAD(O_ONLY));
  /*Output - FIG. 4 # 54 */
A00003100000 PULLINST(.VDDIN(1'b0), .PAD(RESOLVED));
  /*Pullup - FIG. 4 # 56*/
NCR_ISOLATE isol(.X(RESOLVED),.A(O_ONLY));
  /* Isolate - FIG. 4 # 38 */
NCR_EXTERNAL ext1(.VDDIN(1'b1),.PAD(RESOLVED));
  /* External - FIG. 4 # 42 */
NCR_SWITCH sw1(.X(RESOLVED),.A(PAD));
  /* Switch - FIG. 4 # 43 and 44 */
endmodule
//***********************************************************
//Copyright © AT&T Global Information Solutions 1994
`timescale 100ps/10ps
`celldefine
module J0C1S0000000 (PAD,Z);
    input   PAD;
    output  Z;
    specify
      (PAD *> Z) = (1:1:1, 0:0:0);
    endspecify
    buf #(0.1) (Z, PAD);
endmodule
`endcelldefine
//***********************************************************
//Copyright © AT&T Global Information Solutions 1994
`timescale 100ps/10ps
`celldefine
module U00000001IC(A,ENB,PAD);
```

TABLE 5-continued

Split I/O Pad Model Code Listing

```
    input   A, ENB;
    output  PAD;
    specify
      (A *> PAD) = (12:12:12, 12:12:12)
      (ENB *> PAD) = (13:13:13, 12:12:12);
    endspecify
    supply1 PWR;
    tri PAD;
    DELAY_BUF d1(ENB1_d,ENB);
    DELAY_BUF d2(ENB2_d,ENB);
    notif0 (strong1, highz0) (PADX, A, ENB1_d);
    notif0 (highz1, strong0) (PADX, A, ENB2_d);
    nmos (PAD, PADX, PWR);
endmodule
`endcelldefine
//***********************************************************
//Copyright © AT&T Global Information Solutions 1994
`timescale 100ps/10ps
`celldefine
//***********************************************************
module A00003100000(VDDIN,PAD)
    input   VDDIN;
    output  PAD;
    supply0 GND;
    supply1 PWR;
    pmos (A, PAD, GND);
    pmos (B, PAD, GND);
    pullup(A);
    pulldown(B);
    UDP_PPD_SLOWer (C_SLOW,A,B,PWR);
    UDP_PPD_FASTer (C_FAST,A,B,PWR);
    DELAY_BUF da0(CS0,C_SLOW);
    DELAY_BUF da1(CS1,CS0);
    DELAY_BUF da2(CS2,CS1);
    DELAY_BUF da3(CS3,CS2);
    DELAY_BUF da4(CS4,CS3);
    DELAY_BUF da5(CS5,CS4);
    DELAY_BUF da6(CS6,CS5);
    DELAY_BUF da7(CS7,CS6);
    DELAY_BUF da8(CS8,CS7);
    DELAY_BUF da9(C1,CS8);
    DELAY_BUF db0(C2,C_FAST);
    and (C12, C1, C2)
    rnmos (PAD,PWR,C12);
    rpmos (PAD,GND,GND);
endmodule
`endcelldefine
//***************************************
//Copyright © AT&T Global Information Solutions 1994
`timescale 100ps/10ps
`celldefine
module NCR_ISOLATE(A,X);
    input A;
    output X;
supply0 GND;
supply1 PWR;
nmos (X, A, PWR);
endmodule
`endcelldefine
//***********************************************************
//Copyright © AT&T Global Information Solutions 1994
`timescale 100ps/10ps
`celldefine
module NCR_EXTERNAL(VDDIN,PAD);
    input   VDDIN;
    inout   PAD;
supply0 GND;
supply1 PWR;
reg NO_X;
    pmos (A, PAD, GND);
    pmos (B, PAD, GND);
    pmos (C, PAD, GND);
    pmos (D, PAD, GND);
    pullup(A);
    pulldown(B);
    nmos (C, GND, PWR);
    nmos (D, PWR, PWR);
```

TABLE 5-continued

Split I/O Pad Model Code Listing

```
    UDP_PPU_SLOWer (C_SLOW,PAD, A,B, C, D, GND,PWR);
    UDP_PPU_FASTer (C_FAST,PAD,A,B, C, D, GND,PWR);
    DELAY_BUF da0 (CS0,C_SLOW);
    DELAY_BUF da1 (CS1,CS0);
    DELAY_BUF da2 (CS2,CS1);
    DELAY_BUF da3 (CS3,CS2);
    DELAY_BUF da4 (CS4,CS3);
    DELAY_BUF da5 (CS5,CS4);
    DELAY_BUF da6 (CS6,CS5);
    DELAY_BUF da7 (CS7,CS6);
    DELAY_BUF da8 (CS8,CS7);
    DELAY_BUF da9 (C1,CS8);
    DELAY_BUF db0 (C2,C_FAST);
    and (C12, C11 C2);
    rnmos (PADX,GND,C12);
    rpmos (PADX,PWR,GND);
    nmos (PAD, PADX, EN);
    NCR_RACE rc1 (EN);
endmodule
`endcelldefine
/*******************************************************
//Copyright © AT&T Global Information Solutions 1994
 `timescale 100ps/10ps
 `celldefine
module NCR_SWITCH(A, X);
inout A;
inout X;
supply0 GND;
supply1 PWR;
 `ifdef TESTER_EMULATION
    nmos (X, A, PWR);
 `else
    tran (X,A);
 `endif
endmodule
`endcelldefine
```

Figure 11:
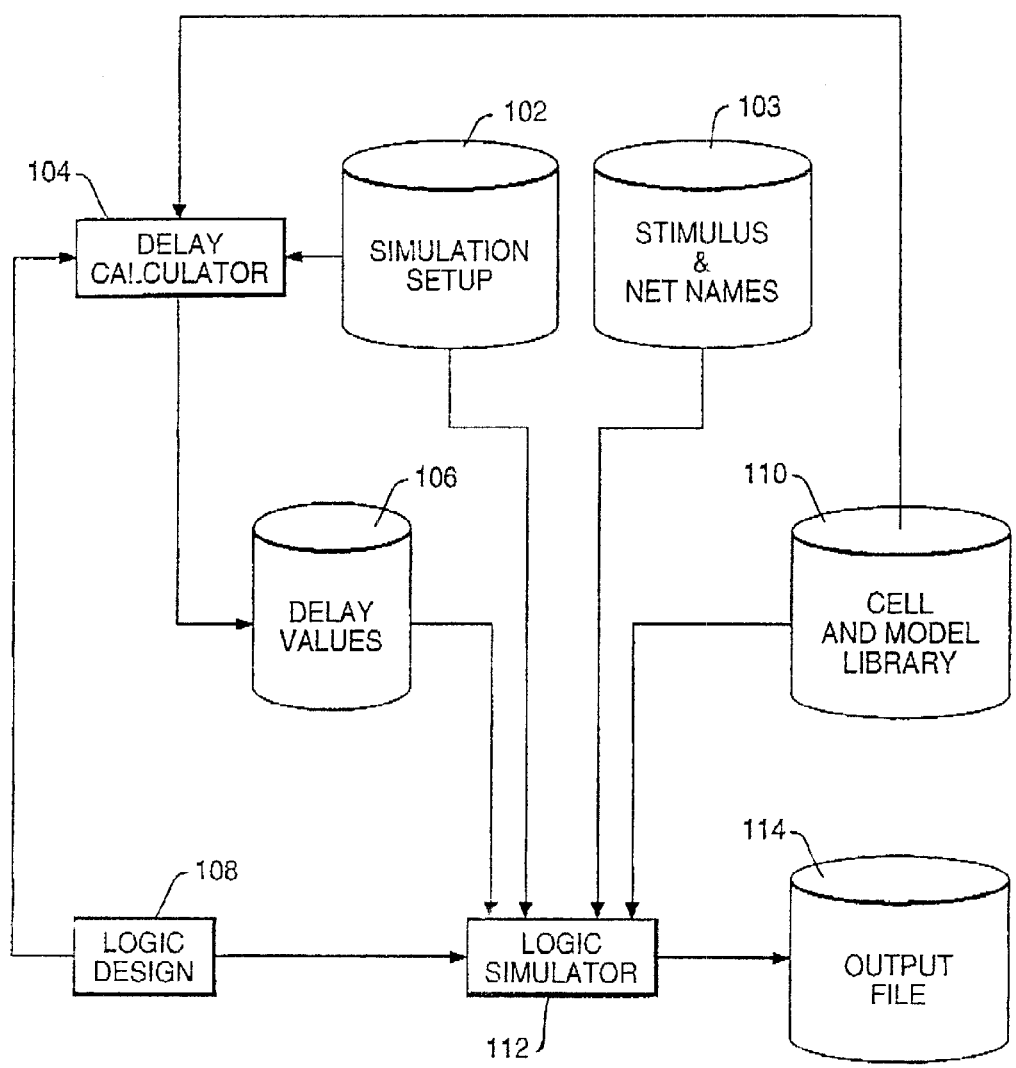
FIG. 11 shows interdependencies for logic simulation of an integrated circuit.

Writing to the output file will now be described. Referring to FIG. 11, it is seen that the logic simulation block 112 gets multiple types of input information, and generates an output file 114. The actual logic design itself is input from 108. Delay values 106, which are the result of a delay calculator 104 such as Node5RC (available from AT&T MPD), are also input to the simulator 112. The delay values 106 are calculated using parameters supplied by the simulation setup file 102 known as simsetup, delay information contained in the cell & model library 110, and the actual logic design 108. The simsetup file 102 also provides information for use by the simulator. The actual stimulus to be applied during simulation, and a list of nets/nodes to be monitored/tracked, are specified in file 103. Finally, the detailed cells/models from library 110 (such as the VS500 library described hereinabove) are input to the simulator, and provide the actual simulation details for the particular logic design to be simulated. During simulation, the simulator outputs various values, including both input stimulus and resulting net/node values (both internal and external). These simulation results are stored in an output file 114 for subsequent processing by other design test tools.

The system is able to instruct the simulator to log the internal signals of the split I/O model through the use of the occurrence name for each I/O pad cell (an occurrence name is a name for a node or net name that is internal to a model, as opposed to a regular node or net name that is external to a model). This requires that the occurrence name information be accessible for use by the simulator. In the preferred embodiment, the occurrence name is stored in a Worksheet database 103 of FIG. 11 (Worksheet is a design test tool available from AT&T MPD that allows a user-friendly front end for specifying various simulator parameters in a manner that is independent of the particular syntax/format of a particular simulator). Normally, the occurrence name will be automatically extracted from the netlist when the Worksheet database is initially created. In schematicless flows, the occurrence names will be generated by Worksheet. In other cases, the user will need to enter the occurrence name information into the Worksheet database.

In summary, the split-I/O technique provides new modeling capabilities. These capabilities include mid-cycle I/O (allowing input stimulus to turn-on and turn-off at times other than cycle boundaries) and improved I/O contention handling. In previous versions of design test tools, the information available in the simulation output files was not sufficient to allow these capabilities. The split-I/O technique provides the design test tools with the extra information necessary to fully analyze the direction of the data present on the I/O signals. This allows users a greater flexibility in the types of waveforms they may generate during simulation.

The improved modeling of resistive states serves two purposes. First, it eliminates the incorrect design functionality that results when inaccurate resistive states are used to control the input of circuitry. Second, it allows the design test tools to extract proper strobe placements for resistive signals. Without these changes, the patterns produced by the design test tools which involve the strobing of resistive states often result in test failures. These situations require manual—and often numerous—changes to correct the patterns. Since a large majority of all designs utilize some type of pull resistors (internal and/or external), this is a significant issue in the effort to automate test pattern development.

While we have illustrated and described the preferred embodiments of our invention, it is to be understood that we do not limit ourselves to the precise constructions herein disclosed, and the right is reserved to all changes and modifications coming within the scope of the invention as defined in the appended claims.

We claim:

1. An improved pad cell model, comprising:

an input node having a value which reflects data that is supplied to the pad cell from external sources;

an output node having a value which reflects data that is supplied as output from the pad cell; and a resolved node, coupled to the input node and output node, having a value which reflects a combination of the input node value and output node value.

2. The pad cell model of claim 1 wherein the resolved node value also reflects a combination of resistive data which models at least a portion of resistance coupled to a pad cell.

3. The pad cell model of claim 1 further comprising means for selectively connecting the input node to the resolved node.

4. An improved pad cell simulation model, comprising:

an I/O pad;

an output driver;

a buffer coupled between the I/O pad and the output driver; and an input receiver coupled to the I/O pad and having an input and an output, said input receiver comprising means for coupling the input either (i) directly to the output, or (ii) to the output through a second buffer.

* * * * *